United States Patent [19]

Richter

[11] 4,199,749

[45] Apr. 22, 1980

[54] ANGLE CODER HAVING SPROCKET DRIVEN ENDLESS CODE TAPES FOR DETERMINING THE ANGULAR POSITION OF A ROTATABLE SHAFT

[75] Inventor: Hans Richter, Augsburg, Fed. Rep. of Germany

[73] Assignee: H. A. Schlatter AG, Schlieren, Switzerland

[21] Appl. No.: 897,069

[22] Filed: Apr. 17, 1978

[30] Foreign Application Priority Data

Apr. 25, 1977 [DE] Fed. Rep. of Germany ....... 2718336
Jan. 3, 1978 [DE] Fed. Rep. of Germany ....... 2800142

[51] Int. Cl.² ........................................... H03K 13/02
[52] U.S. Cl. .......................... 340/347 P; 250/231 SE; 340/347 M
[58] Field of Search ....... 340/347 M, 347 P, 347 AD; 250/231 SE

[56] References Cited

U.S. PATENT DOCUMENTS

| | | | |
|---|---|---|---|
| 2,866,184 | 12/1958 | Gray | 340/347 P |
| 4,041,483 | 8/1977 | Groff | 250/231 SE X |

*Primary Examiner*—Thomas J. Sloyan
*Attorney, Agent, or Firm*—Pollock, Vande Sande and Priddy

[57] ABSTRACT

An angle encoder, for measuring the angular position of a shaft, comprises at least two code carriers having correlated code indicia thereon, the two code carriers being coupled to the shaft for concurrent movement therewith past a scanning unit, and being so arranged that the relative position of the two code carriers changes successively during successive revolutions of the shaft. The two code carriers can comprise endless code tapes having different lengths, or mesh-engaged code disks having different sizes.

8 Claims, 7 Drawing Figures

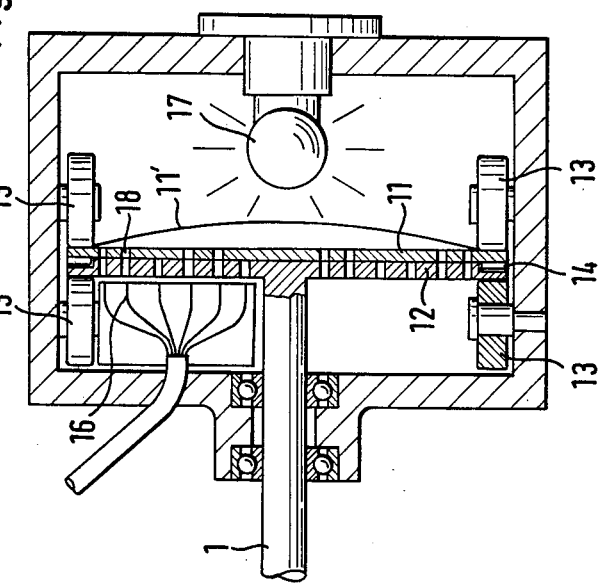
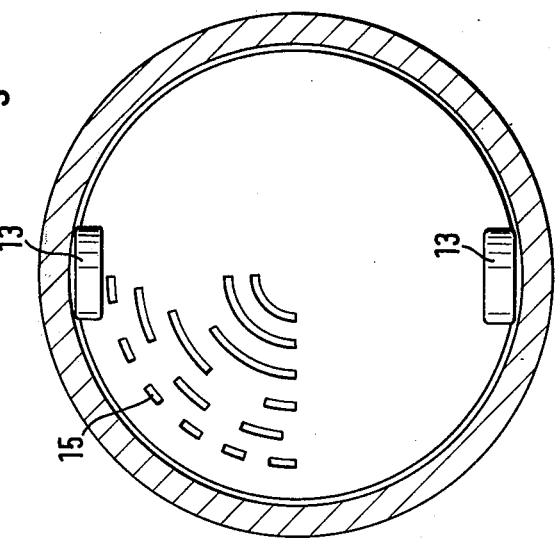
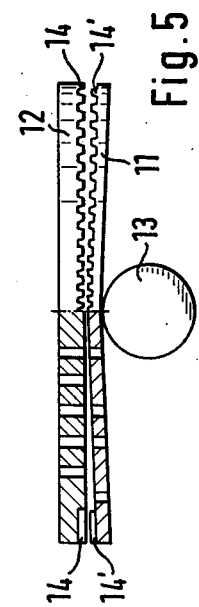

ANGLE CODER HAVING SPROCKET DRIVEN ENDLESS CODE TAPES FOR DETERMINING THE ANGULAR POSITION OF A ROTATABLE SHAFT

The present invention relates to improved angle coders for the digital-coded determination of angles, of the general type wherein a shaft, whose angular position is to be measured, is connected to at least one code carrier whose code is read by a scanning unit as the shaft rotates, a different code word being associated with each angular position of the code carrier.

Angle coders of the foregoing type are known which permit the measurement of angular positions within an arc up to 360°. If it is necessary to measure angles in excess of 360°, a stepdown gearing is placed between the shaft to be measured and the angle coder. One revolution of the angle coder can then correspond to several revolutions of the shaft to be measured. However, the greater the number of shaft revolutions which are equivalent to one revolution of the angle coder, the smaller will become the possibility to obtain specific angular values. The step-down gearing which such arrangements require represent another disadvantageous feature, since the unavoidable play of the gear teeth causes difficulties especially in the case of change in direction. Furthermore, such gears are relatively large and costly, especially in the case of high gear-ratios.

Angle coders with step-down gears are not practical if the measuring range goes far beyond 360°, i.e., when a comparatively large number of shaft revolutions require angular measurements. In this latter case, a counting system is often used where one counting pulse is produced during each shaft rotation for the purpose of counting the number of times the shaft revolves through 360°. This method has the disadvantage, however, that the forward and backward count can very easily lead to a counting error with the result that the measurement will become faulty by at least one full shaft turn.

It is the object of the present invention to provide angle coders which are so constructed that angles in excess of 360° can be readily and accurately measured without the need for using counting pulses to count the shaft revolutions. This object is achieved by providing an angle encoder which comprises at least two endless code carriers which are attached to the shaft whose angle is to be measured, said code carriers being so arranged that their positions relative to one another changes automatically from one turn to the next of the shaft. This arrangement is particularly advantageous because the angle coder can be connected directly to the shaft whose angular position is to be measured. It thus becomes possible to determine without any difficulties the angular positions within several hundred shaft turns in coded form, and the resolution, that is the accuracy of the measurements, is not influenced adversely by the number of turns.

Practical examples of the invention will now be explained in detail with reference to the accompanying drawings, wherein:

FIG. 3 is a longitudinal cross section of a second embodiment;

FIG. 4 is a front view of the embodiment shown in FIG. 3;

FIG. 5 depicts a portion of the embodiment shown in FIGS. 3 and 4;

Figure 1:
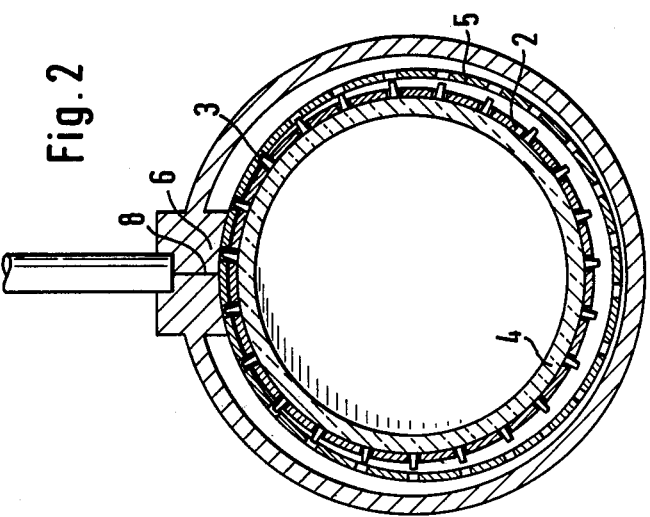
FIG. 1 is a longitudinal cross section of a first embodiment of the invention.
Figure 2:
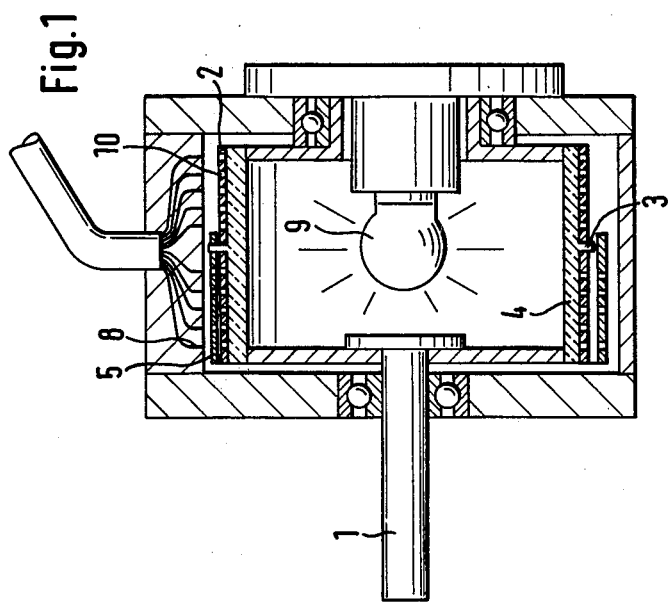
FIG. 2 is a transverse section of the embodiment of FIG. 1.

The species shown in FIGS. 1 and 2 make it possible to read the angular position of a rotatable shaft 1 in code form. The shaft 1 carries for this purpose a transparent cylinder 4 with a stationary light source 9 arranged inside the cylinder. A first endless tape 2 is placed onto the cylinder 4 as code carrier which, in the case illustrated, extends across the entire width of the cylinder 4. A second endless tape 5 is provided on cylinder 4 as an additional code carrier; but the length, or diameter, respectively, of tape 5 is larger than the length or diameter of tape 2. Sprockets 3 which project outwardly of the cylinder 4 extend through sprocket holes in tape 2 to hold the tape 2 in place on cylinder 4, and those sprockets 3, cooperating with sprocket holes in tape 5 also serve to carry along the tape 5 when shaft 1 is turning. Due to the greater length of tape 5, tape 5 rests on, or has a region of contact with, only part of the tape 2. Adjacent this region of contact between the two tapes is provided a scanning unit 8, namely an array of photodiodes in the case illustrated. These photodiodes 8 scan the code holes 10 which are provided in tapes 2 and 5, through which holes light passes from the light source 9 to provide a coded representation of the particular angular position of shaft 1.

If one denotes the circumference of the shorter endless code tape 2 by "u" and the circumference of the longer endless code tape 5 by "U", the positions of the two tapes 2, 5 relative to each other will change for every turn of shaft 1 by $$\Delta U = U - u.$$

In the embodiment illustrated in FIGS. 1 and 2, where the tape 2 is placed directly onto the cylinder 4, tape 2 serves as a turn divider while the longer tape 5 acts as a revolution counter. The number of complete revolutions which can be monitored before there is a recurrence of an initial code combination, is expressed by $$U/\Delta U.$$

In the embodiment illustrated in FIGS. 1 and 2, the code tape 5 partially overlaps the code tape 2. Within the region of overlap, the codes of the two tapes 2, 5 must be correlated with each other. However, it is also feasible to arrange the two code tapes 2, 5 side-by-side. The coding potentialities can be increased still further, by providing the same unit with a third code tape which has a circumference that is greater than the circumference of the code tape 5. If one denotes the circumference of the third code tape by "V", the code tape 2 and the third code tape will then move relative to each other by:

$$\Delta V = V - u,$$

and the number of shaft turns which can take place until an initial code words recurs will then be:

$$(U/\Delta U) \cdot (V/\Delta V).$$

In the modified form of the invention shown in FIGS. 3 to 5, the shaft 1 is rigidly connected with a code disk 12 which is located at the front end of the shaft. The rim of code disk 12 carries a tooth system 14. Closely adjacent code disk 12 there is provided an additional code disk 11 which, in the case illustrated, is slightly conical. Code disk 11 also carries at its rim a tooth system 14'. The tooth systems 14, 14' of the code disks 11, 12 are kept engaged at two opposed points by roller pairs 13. One of the two disks, e.g., code disk 11, has a lesser number of teeth than the other code disk 12. The two disks 11, 12 will therefore turn relative to one another for every turn of the shaft 1 by an amount which is a function of the difference in the numbers of teeth in the two tooth systems. As a result of the bearing pressure exerted by the roller pairs 13, and the conical shape of the code disk 11, disk 11 will bulge as indicated by the reference numeral 11'.

The code tracks or slots on the disks are denoted in FIG. 4 by the numeral 15. A scanning unit 16 is positioned adjacent the area where the code disks 11, 12 are in contact with each other. A light source 17 is arranged in front of the code disks, i.e., on the side of the disks opposite to scanning unit 16. The scanning unit 16 is again formed by photodiodes, and those holes through which light passes from the light source 17 will be read by the scanning unit 16. The combination possibilities described in connection with FIGS. 1 and 2 also apply to the embodiment shown in FIGS. 3 to 5.

The lower roller pair 13 can be omitted if it is assured that the two code disks 11 and 12 will rest upon each other within the region of the scanning unit 16. This can be accomplished, for example, by providing a stationary slotted diaphragm within the region of the scanning unit 16 which presses against the disk 11, thus forcing it against the disk 12 so that the light from the light source 17 can pass through the slotted diaphragm unimpededly onto the code disk 11 within the region of the scanning unit 16.

Figure 6:
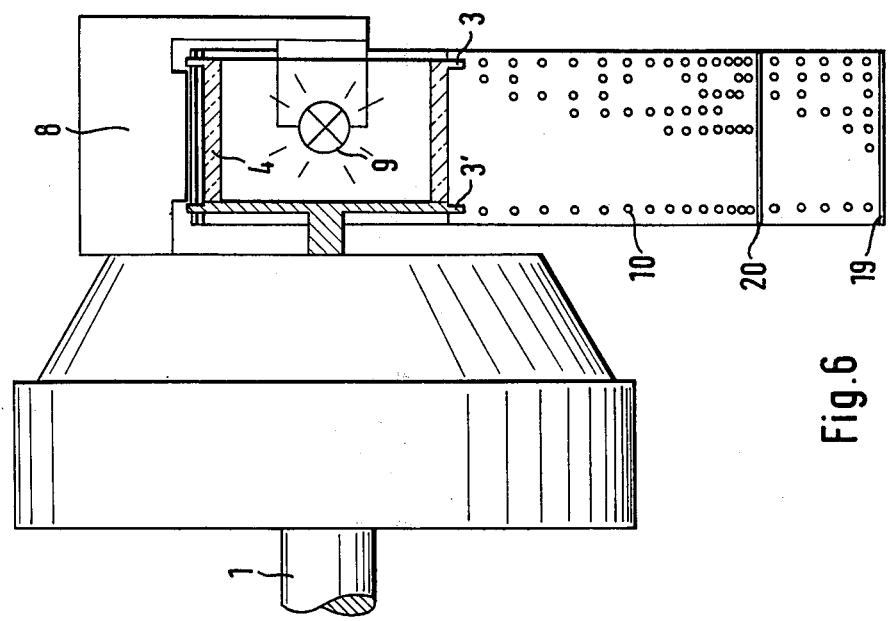
FIG. 6 illustrates a third embodiment in side view, and partially in a sectional view.
Figure 7:
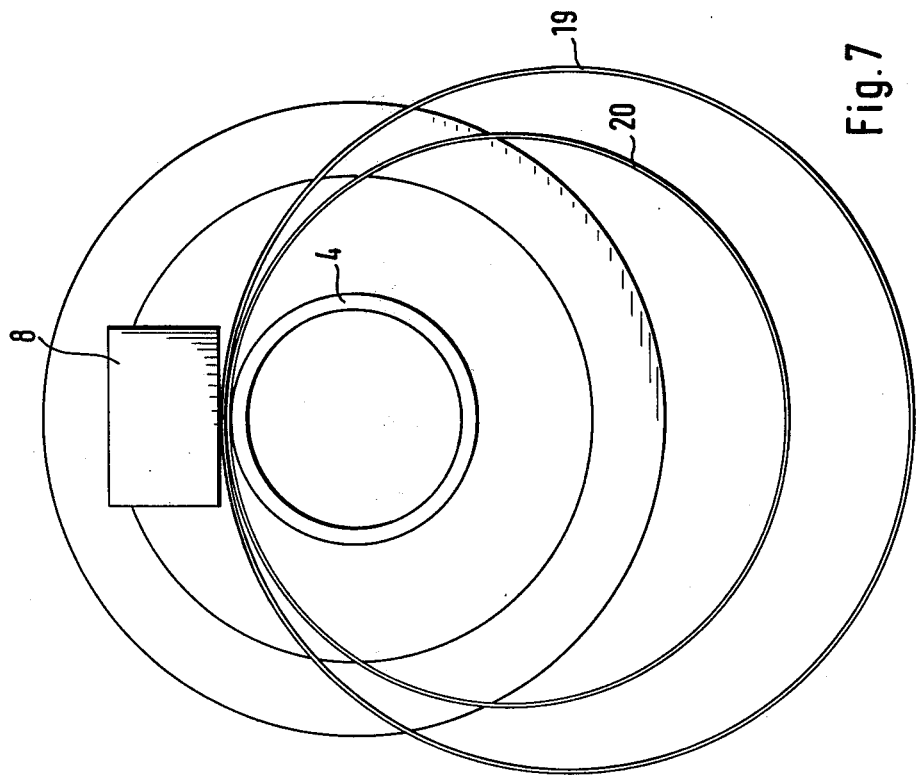
FIG. 7 is a front view of the embodiment illustrated in FIG. 6.

The embodiment shown in FIGS. 6 and 7 is substantially identical to the embodiment illustrated in FIGS. 1 and 2, the main difference being that the two endless code tapes 19, 20 each have a circumference which is much greater than the circumference of the cylinder 4. In the form of the invention illustrated in FIGS. 6 and 7, the two code tapes 19, 20 are superposed. However, it is also feasible to arrange the code tapes side-by-side, as discussed in reference to FIGS. 1 and 2.

In the embodiments shown in FIGS. 1, 2, 6 and 7 the code tapes 2, 5 and 19, 20 respectively are always moved by the shaft 1 at identical speeds. Their relative positions change due to the diverse peripheral lengths of the tapes. However, it is also possible to change the relative positions of the tapes by moving them at diverse speeds. For this purpose the unit can be provided with two cylinders 4 of dissimilar diameter. One code tape, having a circumference greater than the circumference of its associated cylinder, moves over one of the cylinders. On the other cylinder, which differs in diameter from said one cylinder, there can move a like tape but it is also possible to place the second tape directly onto this other cylinder. Here again it is feasible to provide more than two tapes, for example the unit can have two tapes moving at one cylinder in accordance with FIGS. 1, 2, 6 and 7 while a third tape moves at a second cylinder whose diameter differs from the diameter of the first cylinder.

Having thus described my invention, I claim:

1. In an angle coder for digital-coded determination of angles of the type comprising a rotatable shaft whose angular position is to be measured, and a coding device connected to said shaft for rotation therewith, said coding device having coded indicia thereon which are read by a scanning unit, a different code word read by said scanning unit being associated with each angular position of the code carrier, the improvement wherein said coding device comprises cylinder means consisting of at least one cylinder coupled to said shaft for rotation with said shaft, said cylinder means having sprockets thereon, at least two code carriers which are moved concurrently by rotation of said cylinder means past the scanning unit, said code carriers comprising two endless flexible tapes overlying the periphery of said cylinder means and having sprocket holes therein which are engaged by said cylinder sprockets for positive drive and alignment of said flexible tapes and to maintain said tapes at fixed axial positions relative to said cylinder means as said cylinder means is rotated, said two endless tapes being so arranged that their positions relative to one another changes successively during successive revolutions of the shaft.

2. The angle coder of claim 1 wherein said two endless tapes are moved by the cylinder means at identical surface speeds, the peripheral lengths of said two tapes being dissimilar.

3. The angle coder of claim 1 wherein said two tapes are moved by said cylinder means at different surface speeds.

4. The angular coder of claim 3 wherein the two tapes have dissimilar peripheral lengths.

5. The angle coder of claim 3 wherein the two tapes have identical peripheral lengths.

6. The angle coder of claim 1 wherein said endless tapes have different lengths, both of said tapes resting upon the periphery of the same cylinder at least at a position adjacent the scanning unit.

7. The angle coder of claim 1 wherein said endless tapes have different lengths and are coupled to different cylinders respectively having different diameters, the tapes resting upon their associated cylinders at least at positions adjacent the scanning unit.

8. The angle coder of claim 1 wherein said tapes are disposed closely adjacent one another and have correlated code traces thereon.

* * * * *